United States Patent
Kawanishi et al.

(10) Patent No.: US 10,388,812 B2
(45) Date of Patent: Aug. 20, 2019

(54) METHOD OF RECYCLING SOLAR CELL MODULE

(71) Applicants: TOHO KASEI CO., LTD., Yamatokoriyama-shi, Nara (JP); DAIKIN INDUSTRIES, LTD., Osaka-shi, Osaka (JP)

(72) Inventors: Takanori Kawanishi, Yamatokoriyama (JP); Kazuhiro Sumi, Fuchu (JP); Yoshiaki Hayashi, Fuchu (JP); Toshirou Motoji, Osaka (JP)

(73) Assignees: TOHO KASEI CO., LTD., Yamatokoriyama-Shi, Nara (JP); DAIKIN INDUSTRIES, LTD., Osaka-Shi, Osaka (JP)

(*) Notice: Subject to any disclaimer, the term of this patent is extended or adjusted under 35 U.S.C. 154(b) by 0 days.

(21) Appl. No.: 15/760,805

(22) PCT Filed: Sep. 16, 2016

(86) PCT No.: PCT/JP2016/077584
§ 371 (c)(1),
(2) Date: Mar. 16, 2018

(87) PCT Pub. No.: WO2017/047802
PCT Pub. Date: Mar. 23, 2017

(65) Prior Publication Data
US 2018/0254364 A1 Sep. 6, 2018

(30) Foreign Application Priority Data
Sep. 18, 2015 (JP) .................... 2015-185738

(51) Int. Cl.
*B32B 43/00* (2006.01)
*H01L 31/049* (2014.01)
(Continued)

(52) U.S. Cl.
CPC .............. *H01L 31/049* (2014.12); *B09B 3/00* (2013.01); *B09B 5/00* (2013.01); *C08L 23/0853* (2013.01);
(Continued)

(58) Field of Classification Search
CPC ......... H01L 31/18; H01L 31/049; B09B 3/00; C08J 11/06; B32B 38/10; B32B 43/006;
(Continued)

(56) References Cited

U.S. PATENT DOCUMENTS

| | | | |
|---|---|---|---|
| 4,131,659 A | 12/1978 | Authier et al. | |
| 2008/0105294 A1* | 5/2008 | Kushiya | B32B 17/10018 136/252 |

(Continued)

FOREIGN PATENT DOCUMENTS

| | | |
|---|---|---|
| JP | 11-330345 A | 11/1999 |
| JP | 2006-179626 A | 7/2006 |

(Continued)

OTHER PUBLICATIONS

International Search Report for PCT/JP2016/077584 dated Nov. 8, 2016.
(Continued)

*Primary Examiner* — Mark A Osele
*Assistant Examiner* — Nickolas R Harm
(74) *Attorney, Agent, or Firm* — Birch, Stewart, Kolasch & Birch LLP

(57) ABSTRACT

A method of recycling a solar cell module includes an enclosing layer that encloses a solar cell therein, a light-receiving surface layer laminated on one surface of the enclosing layer, and a back sheet laminated on the other surface of the enclosing layer, the method including: a first removing step of mechanically removing the back sheet; a second removing step of mechanically removing from a side
(Continued)

on which the back sheet is removed the entire solar cell and the enclosing layer to such a depth that a part of the enclosing layer having a predetermined thickness remains on the light-receiving surface layer, after the first removing step; and a third removing step of removing the part of the enclosing layer remaining on the light-receiving surface layer by immersion in a solution that causes swelling of the enclosing layer, after the second removing step, thereby improving an overall efficiency.

9 Claims, 6 Drawing Sheets

(51) Int. Cl.
| | |
|---|---|
| B09B 3/00 | (2006.01) |
| B09B 5/00 | (2006.01) |
| H01L 31/042 | (2014.01) |
| C08L 23/08 | (2006.01) |
| H01L 31/18 | (2006.01) |
| B29B 17/02 | (2006.01) |
| C08J 11/06 | (2006.01) |
| B32B 38/10 | (2006.01) |

(52) U.S. Cl.
CPC ............ *H01L 31/042* (2013.01); *H01L 31/18* (2013.01); *B29B 17/02* (2013.01); *B32B 38/10* (2013.01); *B32B 43/006* (2013.01); *C08J 11/06* (2013.01); *Y02E 10/50* (2013.01); *Y02P 70/521* (2015.11); *Y02W 30/20* (2015.05); *Y02W 30/622* (2015.05); *Y02W 30/827* (2015.05); *Y10T 156/11* (2015.01); *Y10T 156/1147* (2015.01); *Y10T 156/1168* (2015.01); *Y10T 156/19* (2015.01); *Y10T 156/1961* (2015.01); *Y10T 156/1967* (2015.01); *Y10T 156/1972* (2015.01)

(58) Field of Classification Search
CPC .. B29B 17/02; Y10T 156/11; Y10T 156/1147; Y10T 156/1168; Y10T 156/19; Y10T 156/1961; Y10T 156/1967; Y10T 156/1972
USPC ................ 156/701, 710, 714, 750, 922, 937
See application file for complete search history.

(56) References Cited

U.S. PATENT DOCUMENTS

| | | | |
|---|---|---|---|
| 2011/0186779 A1* | 8/2011 | Bohland | ................ C22B 7/005 252/301.65 |
| 2018/0257267 A1* | 9/2018 | Aymonier | ............... B29B 17/02 |

FOREIGN PATENT DOCUMENTS

| | | |
|---|---|---|
| JP | 2007-134358 A | 5/2007 |
| JP | 2007-180063 A | 7/2007 |
| JP | 2009-214058 A | 9/2009 |
| JP | 2011-109003 A | 6/2011 |
| JP | 2014-104406 A | 6/2014 |

OTHER PUBLICATIONS

Written Opinion of the International Searching Authority for PCT/JP2016/077584 (PCT/ISA/237) dated Nov. 8, 2016.
International Preliminary Report on Patentability and an English Translation of the Written Opinion of the International Searching Authority (Forms PCT/IB/338, PCT/IB/373, and PCT/ISA/237), dated Mar. 29, 2018, for International Application No. PCT/JP2016/077584.
Extended European Search Report, dated Apr. 16, 2019, for European Application No. 16846673.8.

* cited by examiner

METHOD OF RECYCLING SOLAR CELL MODULE

FIELD OF THE INVENTION

The present invention relates to a method of recycling a solar cell module and more specifically to a method of recycling a solar cell module including an enclosing layer that encloses a solar cell, a light-receiving surface layer and a back sheet both laminated on the enclosing layer to be opposite to each other.

BACKGROUND OF THE INVENTION

Various methods of recycling solar cell modules have been proposed (e.g., Patent Document 1).

A method disclosed in Patent Document 1 mechanically removes a back sheet of a solar cell module by an NC router grinding machine, and then forms grid slits on a surface of a enclosing layer by the same NC router grinding machine. Subsequently, the method immerses the solar cell module in a peeling liquid so as to instill the peeling liquid into the enclosing layer via the slits formed on the surface, thereby causing swelling of the enclosing layer. The swelling action removes the enclosing layer from a light-receiving surface layer.

PRIOR ART DOCUMENT

Patent Document

Patent Document 1: Japanese Laid-Open Patent Publication No. 2014-104406

SUMMARY OF THE INVENTION

Problem to be Solved by the Invention

However, it is recently required to more efficiently perform a method of recycling a solar cell module. In the recycling method of Patent Document 1, the module is immersed in the peeling liquid and the swelling action of the enclosing layer due to the peeling liquid is mainly utilized for removing the enclosing layer. In such a case, several hours to several tens of hours, for example, are required for removing the enclosing layer. A long time is required for removing the enclosing layer, and thus there is still room for improvement in terms of an overall efficiency of a recycling method.

Therefore, an object of the present invention is to provide a method of recycling a solar cell module capable of shortening a time required for removing an enclosing layer, thereby improving an overall efficiency.

Means for Solving Problem

To achieve the object, the present invention is configured as follows.

An aspect of the present invention provides a method of recycling a solar cell module comprising an enclosing layer that encloses a solar cell therein, a light-receiving surface layer laminated on one surface of the enclosing layer, and a back sheet laminated on the other surface of the enclosing layer, the method comprising: a first removing step of mechanically removing the back sheet; a second removing step of mechanically removing from a side on which the back sheet is removed the entire solar cell and the enclosing layer to such a depth that a part of the enclosing layer having a predetermined thickness remains on the light-receiving surface layer, after the first removing step; and a third removing step of removing the part of the enclosing layer remaining on the light-receiving surface layer by immersion in a solution that causes swelling of the enclosing layer, after the second removing step.

Effect of the Invention

The recycling method of the present invention can shorten a time required for removing the enclosing layer, thereby improving an overall efficiency.

BRIEF DESCRIPTION OF THE DRAWINGS

These aspects and features of the present invention will become apparent from the following description related to a preferable embodiment with reference to the accompanying drawings.

DETAILED DESCRIPTION OF THE PREFERRED EMBODIMENT

Figure 1:
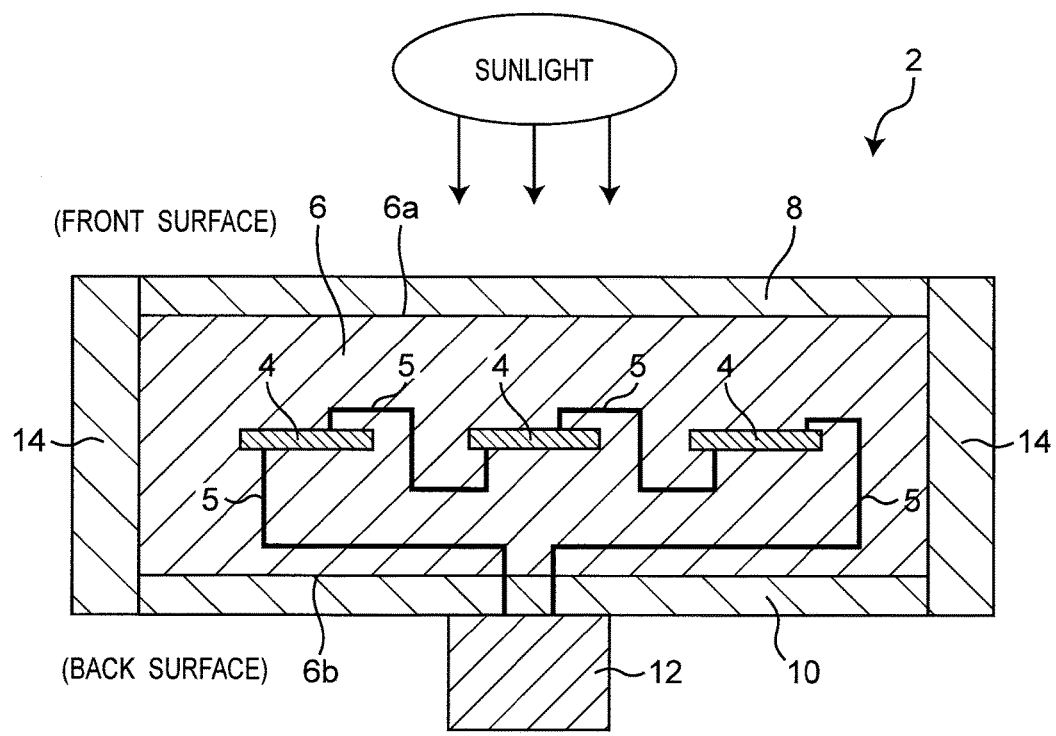
FIG. 1 shows a cross-sectional view of a solar cell module according to an embodiment.

A first aspect of the present invention is a method of recycling a solar cell module comprising an enclosing layer that encloses a solar cell therein, a light-receiving surface layer laminated on one surface of the enclosing layer, and a back sheet laminated on the other surface of the enclosing layer, the method comprising: a first removing step of mechanically removing the back sheet; a second removing step of mechanically removing from a side on which the back sheet is removed the entire solar cell and the enclosing layer to such a depth that a part of the enclosing layer having a predetermined thickness remains on the light-receiving surface layer, after the first removing step; and a third removing step of removing the part of the enclosing layer remaining on the light-receiving surface layer by immersion in a solution that causes swelling of the enclosing layer, after the second removing step.

According to a second aspect of the present invention, the third removing step performs grinding after the immersion in the solution for removing the enclosing layer remaining on the light-receiving surface layer, in the method of recycling a solar cell module according to the first aspect.

According to a third aspect of the present invention, the third removing step uses a brush for the grinding, in the method of recycling a solar cell module according to the second aspect.

According to a fourth aspect of the present invention, the method of recycling a solar cell module according to any one of the first to third aspects further comprises a pulverizing step of pulverizing the solar cell and the enclosing layer removed by the second removing step, and a separating step of separating the pulverized solar cell and the pulverized enclosing layer from each other using specific gravity separation by immersing them in a solution.

According to a fifth aspect of the present invention, an alkaline hydrocarbon-based solvent is applied to the solar cell and the enclosing layer in the pulverizing step, in the recycling method of a solar cell module according to the fourth aspect.

According to a sixth aspect of the present invention, the solution used in the separating step has a change rate of specific gravity associated with temperature increase, the change rate being smaller than that of the enclosing layer, in the method of recycling a solar cell module according to the fourth or fifth aspect.

According to a seventh aspect of the present invention, the second removing step performs a step of mechanically removing the enclosing layer to a depth not reaching the solar cell from the side on which the back sheet is removed, and separately performs a step of mechanically removing the remaining enclosing layer enclosing the solar cell, in the method of recycling a solar cell module according to any one of the first to sixth aspects.

According to an eighth aspect of the present invention, the solution used in the third removing step is a neutral peeling agent containing a water-soluble hydrocarbon-based solvent, in the method of recycling a solar cell module according to any one of the first to seventh aspects.

According to a ninth aspect of the present invention, the enclosing layer is made of an ethylene-vinyl acetate copolymer, in the method of recycling a solar cell module according to any one of the first to eighth aspects.

An embodiment of the present invention will now be described in detail with reference to the drawings.
(Embodiment)

A solar cell module 2 is a module configured to convert light energy of sunlight into electric energy. The solar cell module 2 is provided as a solar panel on a roof of a building, etc. As shown in FIG. 1, the solar cell module 2 according to this embodiment includes a plurality of solar cells 4, a plurality of metal wirings 5, an enclosing layer 6, a light-receiving surface layer 8, a back sheet 10, a collector box 12, and a frame 14.

The solar cells 4 are elements for converting light energy of sunlight into electric energy. The solar cells 4 are made of silicon, for example. The metal wirings 5 are configured to connect terminals (not shown) of the solar cells 4 to each other. The metal wirings 5 for connecting the plurality of the solar cells 4 to each other are connected to the collector box 12 described later. The electric energy generated by the solar cells 4 is supplied to the collector box 12 via the metal wirings 5. The enclosing layer 6 is a member that encloses and protects the solar cells 4 and the metal wirings 5. The enclosing layer 6 is made of a light-transmitting material capable of transmitting sunlight. The material of the enclosing layer 6 is ethylene-vinyl acetate copolymer (EVA) or PVB (polyvinyl butyral), for example. In this embodiment, EVA is used as the material of the enclosing layer 6.

As shown in FIG. 1, the light-receiving surface layer 8 and the back sheet 10 are attached to the enclosing layer 6, being opposite to each other. The light-receiving surface layer 8 is disposed on one surface (front surface 6a) of the enclosing layer 6, and the back sheet 10 is disposed on the other surface (back surface 6b) of the enclosing layer 6. The light-receiving surface layer 8 is a layer configured to receive sunlight, and constitutes a front surface of the solar cell module 2. The light-receiving surface layer 8 is made of a light-transmitting material for transmitting sunlight similarly to the enclosing layer 6. The material of the light-receiving surface layer 8 may be a transparent material or a semi-transparent material such as glass and plastic, for example. The back sheet 10 is a back-surface member of the solar cell module 2. The collector box 12 is bonded and fixed to a back side of the back sheet 10. The collector box 12 is a box configured to collect electric energy supplied via the metal wirings 5. The frame 14 is an outer frame for protecting the solar cell module 2 from a physical impact. The frame 14 of this embodiment is fastened by screws in the solar cell module 2. A material of the frame 14 may be aluminum, iron, or plastic, for example.

The enclosing layer 6 encloses the metal wirings 5 on a side of the back surface 6b where the back sheet 10 is disposed. On the other hand, the enclosing layer 6 encloses a portion not including the metal wirings 5 on an opposite side of the front surface 6a where the light-receiving surface layer 8 is disposed. Therefore, the enclosing layer 6 has the portion of a predetermined thickness from the surface 6a as a high purity layer not including the metal wirings 5 or the solar cell 4.

Figure 2:
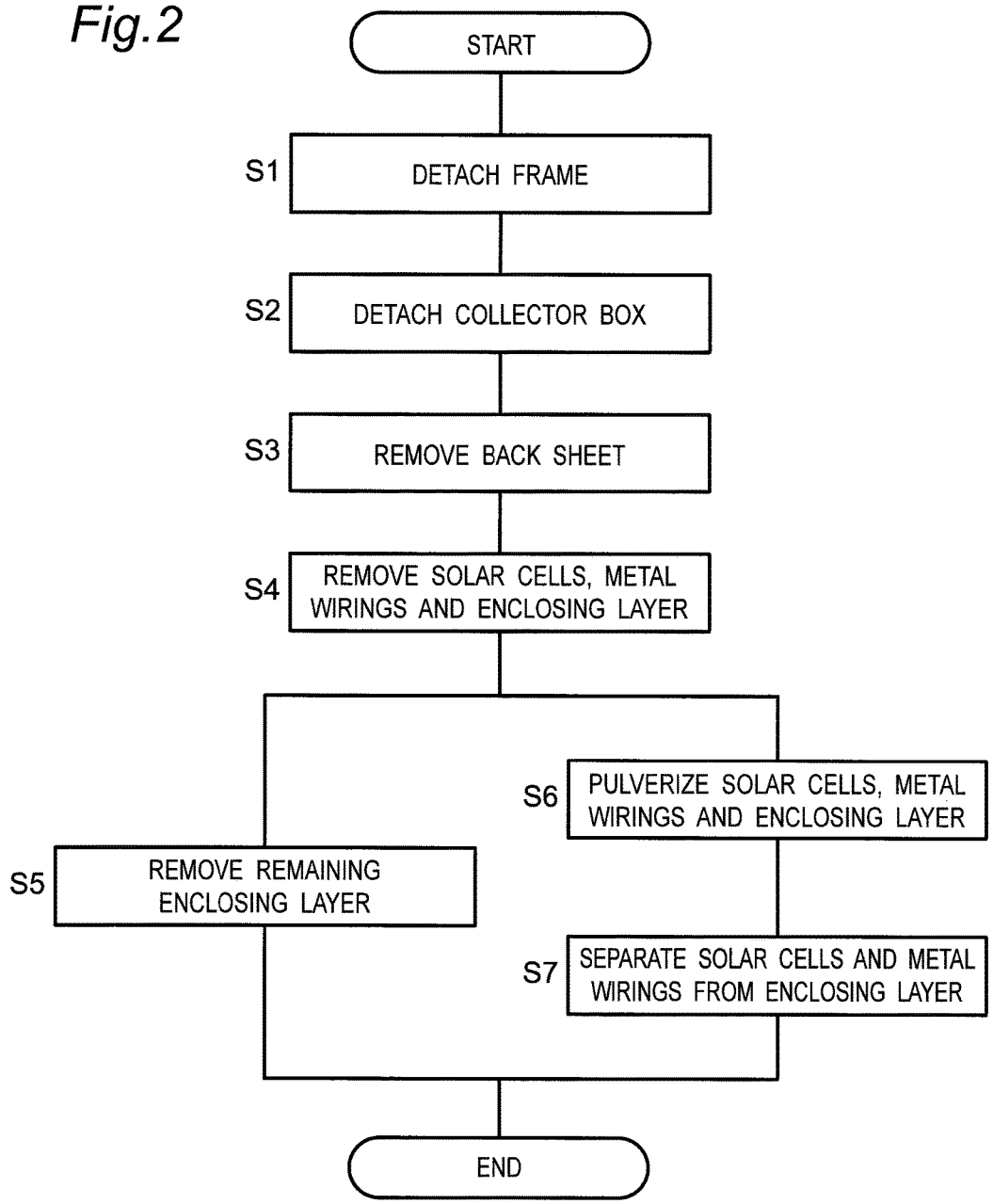
FIG. 2 shows a flowchart of a method of recycling a solar cell module according to an embodiment.
Figure 3:
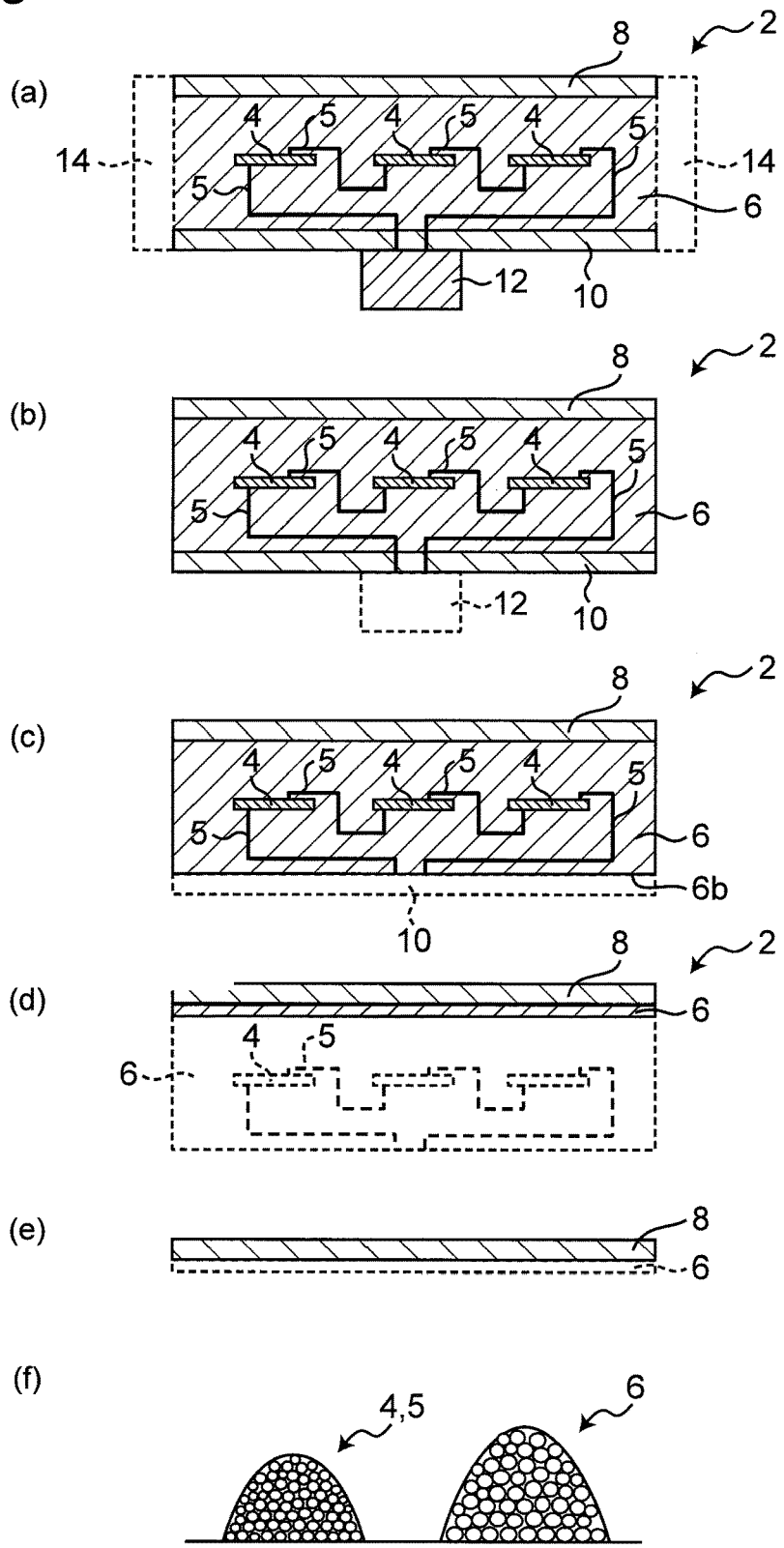
FIG. 3 shows a cross-sectional view for explaining the recycling method performed according to the flowchart shown in FIG. 2.

Next, a recycling method of recycling the solar cell module 2 having such a structure by separating the solar cell module 2 into members (materials) will be described with reference to FIGS. 2 and 3. FIG. 2 shows a flowchart of the recycling method in this embodiment. FIG. 3 shows a cross-sectional view for explaining the recycling method performed according to the flowchart shown in FIG. 2.

First, the frame 14 is detached (step S1). More specifically, the frame 14 fastened by screws in the solar cell module 2 is detached by hand as shown in FIG. 3(*a*).

Then, the collector box 12 is detached (step S2). More specifically, the collector box 12 bonded and fixed to the back sheet 10 is detached by using, for example, a high frequency cutter, as shown in FIG. 3(*b*).

Then, the back sheet 10 is removed (step S3: first removing step). More specifically, the back sheet 10 attached to the back surface 6b of the enclosing layer 6 is mechanically removed. For removing the back sheet 10 from the solar cell module 2 as shown in FIG. 3(*c*), the back sheet 10 is ground from the back-surface side by using, for example, an NC router grinding machine. "Mechanical removal" refers to removing with use of a mechanical means, and does not cover removing (peeling) by immersion in a solution over time.

The solar cells 4, the metal wirings 5, and the enclosing layer 6 are removed (step S4: second removing step). More specifically, the solar cells 4, the metal wirings 5, and the enclosing layer 6 are mechanically removed from the solar cell module 2. For example, by using the same NC router grinding machine as in step S3, the solar cells 4, the metal wirings 5, and the enclosing layer 6 are ground from the back-surface side on which the back sheet 10 is removed. As a result, as shown in FIG. 3(*d*), the solar cells 4, the metal wirings 5, and the enclosing layer 6 are removed from the solar cell module 2. As a result, the solar cells 4 and the metal wirings 5 are entirely removed, while the enclosing layer 6 is partially removed. More specifically, the enclosing layer 6 is removed to a depth between the light-receiving surface layer 8 and the solar cells 4 so that a part of the enclosing layer 6 having a thin thickness (e.g., 0.1 mm) adheres to and remains on the light-receiving surface layer 8. By removing the enclosing layer 6 to the extent that the light-receiving surface layer 8 is not ground, the light-receiving surface layer 8 can be prevented from being damaged by the NC router grinding machine, and thus a reuse value of the light-receiving surface layer 8 can be increased. The solar cells 4, the metal wirings 5, and the enclosing layer 6 after the removal are collected, and then pulverized at later step S6, and then subjected to specific gravity separation at step S7.

In this way, removing a large portion of the enclosing layer 6 at step S4 can reduce an amount of peeling liquid used in subsequent step S5. This leads to significant cost reduction especially when the peeling liquid is expensive. Removing all of the solar cells 4 and the metal wirings 5 can remove silicon (that is, the solar cells 4) and metal (that is, the metal wirings 5) which act as factors inhibiting swelling/removing action of the peeling liquid at subsequent step S5.

The removal of the enclosing layer 6 performed at step S4 in this embodiment is divided into two major stages. More specifically, a first stage is to mechanically remove the enclosing layer 6 from the back-surface side, on which the back sheet 10 is removed, to a depth not reaching the solar cell 4. Subsequently, a second stage is to mechanically remove the enclosing layer 6 which encloses the solar cell 4. According to such a two-staged removing step, the enclosing layer 6 is removed to a depth at which a part of the enclosing layer 6 having a predetermined thickness adheres to and remains on the light-receiving surface layer 8. Thus, the enclosing layer 6 (enclosing the metal wirings 5) which does not enclose the solar cell 4 can be collected in the first stage, while the enclosing layer 6 which encloses the solar cell 4 can be collected in the second stage. Therefore, the enclosing layer 6 which encloses the solar cell 4 and the enclosing layer 6 which does not enclose the solar cell 4 can be separately collected, and subsequent treatment can be performed to each of the enclosing layers 6 depending on their applications.

Subsequently, the enclosing layer 6 which adheres to and remains on the light-receiving surface layer 8 is removed (step S5: third removing step). More specifically, the light-receiving surface layer 8 together with the adhering enclosing layer 6 is immersed in a predetermined solution (that is, peeling liquid). The peeling liquid may be any liquid that causes swelling and peeling of the enclosing layer 6, such as a neutral peeling agent containing a water-soluble hydrocarbon-based solvent without inflammability, for example. Immersing and swelling the enclosing layer 6 in the peeling liquid generates a shear stress at an interface between the enclosing layer 6 and the light-receiving surface layer 8. The shear stress leads to peeling and removing of the enclosing layer 6 from the light-receiving surface layer 8. Further, at step S5, while heating the peeling liquid during the immersion, ultrasonic waves are generated in the peeling liquid. This enhances a penetrating effect and a swelling effect of the peeling liquid to the enclosing layer 6. A total amount of an obtained light-receiving surface layer 8 (e.g., glass) can be collected intact, and the enclosing layer 6 has been removed therefrom to a certain level such that the obtained light-receiving surface layer 8 can reused with no processing.

The solar cells 4 and the metal wirings 5 are completely removed at preceding step S4, so the enclosing layer 6 collected at step S5 does not include the solar cells 4 or the metal wirings 5. Therefore, the high-purity enclosing layer 6 can be collected and reused. Particularly, if EVA described above is used as the material of the enclosing layer 6, EVA can be recyclable while it has been considered as not recyclable according to conventional methods. Subsequently, the enclosing layer 6 removed at step S5 is collected.

Figure 4:
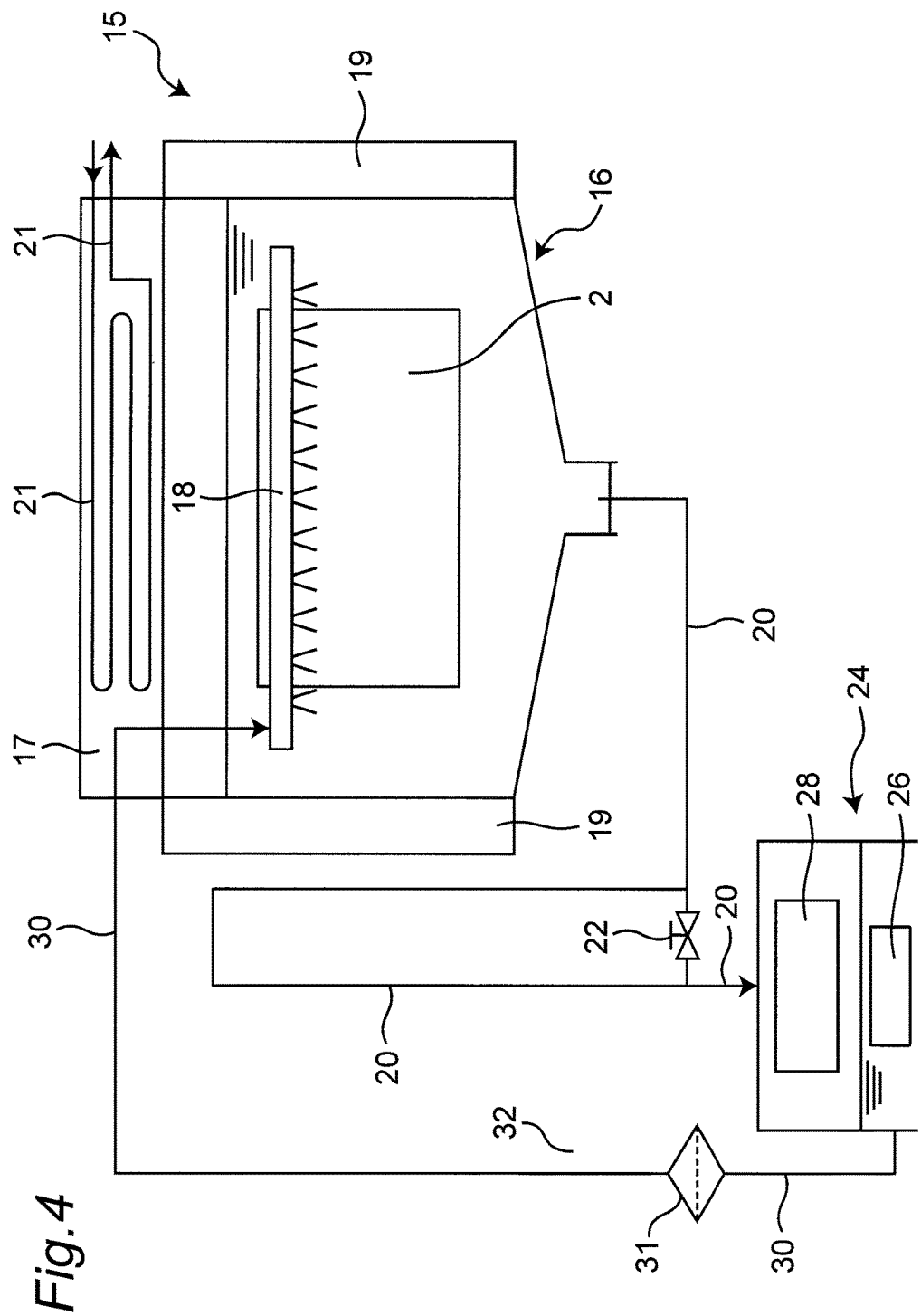
FIG. 4 shows an exemplary apparatus used for immersion in a peeling liquid at step S5.

FIG. 4 shows an exemplary apparatus used for immersion into the peeling liquid used at step S5. The apparatus 15 shown in FIG. 4 includes an immersion tank 16 for immersing the solar cell module 2 therein, an evaporation preventive lid 17, a cooling water piping 21, a peeling-liquid supply nozzle 18, ultrasonic irradiation members 19, a recovery line 20, a valve 22, a buffer tank 24, a heater 26, an enclosing-layer recovery mesh basket 28, a resupply line 30, a filter 31, and a pump 32.

The immersion tank 16 is a tank configured to store the peeling liquid therein for peeling off the enclosing layer 6 from the solar cell module 2. The solar cell module 2 is immersed in the peeling liquid in the immersion tank 16. The evaporation preventive lid 17 is a lid for preventing the peeling liquid from evaporating from the immersion tank 16 to leak out. The evaporation preventive lid 17 functions as a lid of the immersion tank 16 by covering an upper side of the immersion tank 16. The cooling water piping 21 is a piping that allows a cooling water to flow therein for cooling the peeling liquid which adheres to a lower surface of the evaporation preventive lid 17. The cooling water piping 21 penetrates an inside of the evaporation preventive lid 17. Cooling by the cooling water piping 21 can condense and liquefy the peeling liquid on the lower surface of the evaporation preventive lid 17, which was evaporated from the immersion tank 16, so as to be dropped back into the immersion tank 16. The peeling-liquid supply nozzle 18 is a member configured to supply a peeling liquid into the immersion tank 16. The peeling-liquid supply nozzle 18 applies a peeling liquid to the solar cell module 2 for circulating the peeling liquid in the immersion tank 16. The ultrasonic irradiation members 19 are configured to apply ultrasonic waves into the peeling liquid in the immersion tank 16. One of the ultrasonic irradiation members 19 is disposed on a side of the immersion tank 16, while the other is disposed on the other side. The recovery line 20 is a piping line for recovering (collecting) the peeling liquid used in the immersion tank 16. The valve 22 is a valve for controlling flow of the peeling liquid through the recovery line 20. The buffer tank 24 is a tank configured to store the peeling liquid collected from the recovery line 20. The heater 26 is a means of heating the peeling liquid stored in the buffer tank 24. The enclosing-layer recovery mesh basket 28 is configured to collect the removed enclosing layer 6 contained in the peeling liquid sent to the buffer tank 24. The resupply line 30 is a piping line for returning and supplying the peeling liquid stored in the buffer tank 24 and heated by the heater 26 to the immersion tank 16. The filter 31 is a filter for catching impurities in the peeling liquid flowing through the resupply line 30. The pump 32 is a pump for allowing flow of the peeling liquid through the resupply line 30.

According to the apparatus 15, the solar cell module 2 is immersed in the peeling liquid in the immersion tank 16 with being applied with ultrasonic waves from the ultrasonic irradiation part 19 and being applied with a peeling liquid by the peeling-liquid supply nozzle 18. The pump 32 is operated to cause the used peeling liquid in the immersion tank 16 to flow through the recovery line 20 to the buffer tank 24. The enclosing layer 6 contained in the peeling liquid is caught by the enclosing-layer recovery mesh basket 28 and the remaining peeling liquid is stored with being heated by the heater 26. The stored peeling liquid is then supplied through the resupply line 30 again to the peeling-liquid supply nozzle 18 by the operation of the pump 32.

In this way, the enclosing layer 6 of the solar cell module 2 can be peeled off and removed by the peeling liquid, and the removal of the enclosing layer 6 can continuously be performed while reusing the used peeling liquid.

In this embodiment, the enclosing layer 6 is then ground at step S5 described above. Step 5 is performed for removing from the light-receiving surface layer 8 the enclosing layer 6 that remains without being removed by immersion in the peeling liquid. More specifically, the light-receiving surface layer 8 and the enclosing layer 6 immersed in the peeling liquid are taken out from the immersion tank 16, and then the enclosing layer 6 is ground by using a grinding means such as a brush. The enclosing layer 6 is thereby removed from the light-receiving surface layer 8. In this way, grinding after the removing by the immersion can obtain a removing effect by scrubbing.

Figure 5:
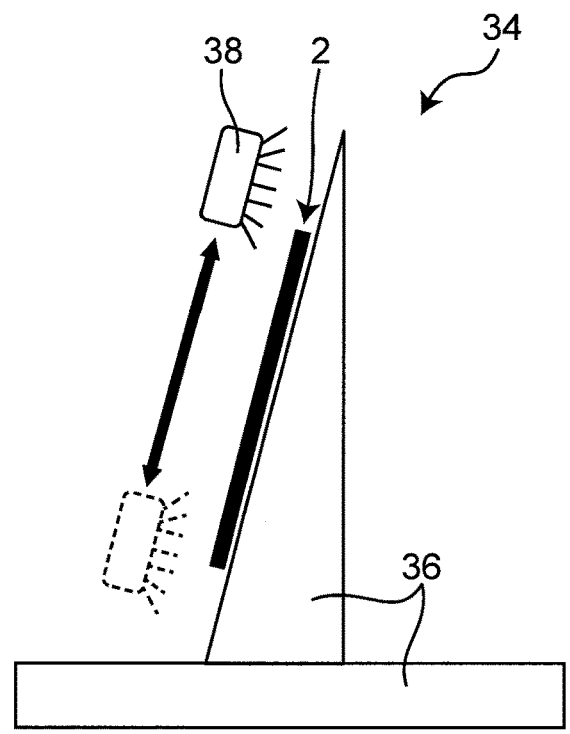
FIG. 5 shows an exemplary apparatus used for grinding at step S5.

FIG. 5 shows an exemplary apparatus used for grinding at step S5. An apparatus 34 shown in FIG. 5 includes a fixing base 36 and a grinding brush 38. The grinding brush 38 is movable in any directions (e.g., two orthogonal directions) which are parallel to an inclined surface on which the solar cell module 2 is mounted on the fixing base 36. According to the apparatus 34, the solar cell module 2 can be ground by the grinding brush 38 while being fixed to the fixing base 36.

In parallel with step S5 of removing the enclosing layer 6 described above, a step of pulverizing the solar cells 4, the metal wirings 5, and the enclosing layer 6 removed at step S4 is performed (step S6). Although already finely crushed through the mechanical removal at step S4, the solar cells 4, the metal wirings 5, and the enclosing layer 6 will be more finely pulverized by a pulverizing means such as a high-speed mixer. As a result, separation of the solar cells 4, the metal wirings 5, and the enclosing layer 6 which remain integrally with each other can be promoted, and also separation accuracy of specific gravity separation at subsequent step S7 described below can be improved. Furthermore, in this embodiment, pulverization is performed with an alkaline hydrocarbon-based solvent added to the solar cells 4, the metal wirings 5, and the enclosing layer 6. The alkaline hydrocarbon-based solvent has an effect of promoting separation of each of the solar cells 4, the metal wirings 5, and the enclosing layer 6. Performing the pulverization by the high-speed mixer with the alkaline hydrocarbon-based solvent added can accurately separate the solar cells 4, the metal wirings 5, and the enclosing layer 6 during the pulverization. Therefore, separation accuracy of specific gravity separation at subsequent step S7 can further be improved.

Figure 6:
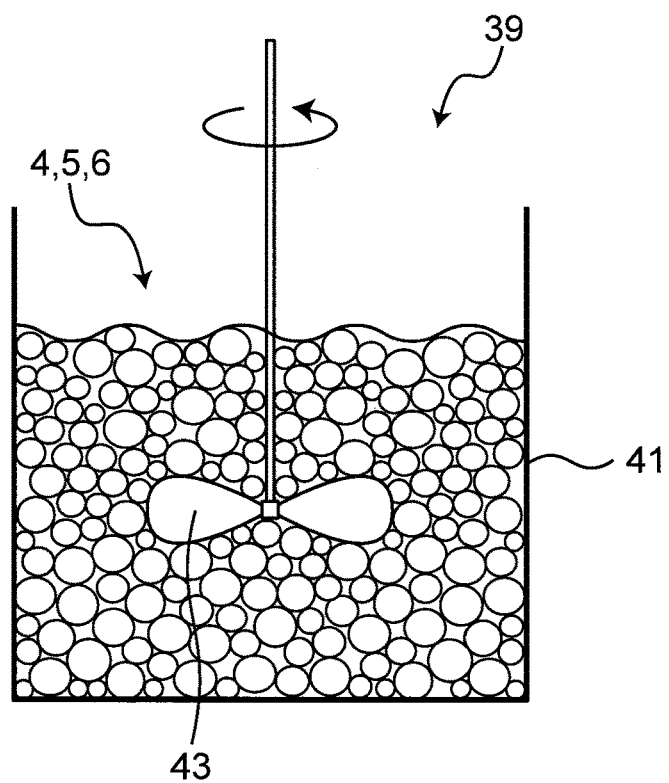
FIG. 6 shows an exemplary apparatus used in step S6.

FIG. 6 shows an exemplary apparatus for performing the pulverization at step S6. A pulverizing apparatus 39 shown in FIG. 6 includes a container 41 and a pulverizing means 43. The container 41 is configured to house the solar cells 4, the metal wirings 5, and the enclosing layer 6 which was removed at step S4. The pulverizing means 43 is configured to pulverize the solar cells 4, the metal wirings 5, and the enclosing layer 6 in the container 41. The pulverizing means 43 in this embodiment are blades capable of rotating at high speed around an axis extending in the vertical direction.

According to such a configuration, the solar cells 4, the metal wirings 5, and the enclosing layer 6 in the container 41 can be pulverized by the pulverizing means 43 with the alkaline hydrocarbon-based solvent described above added thereto.

After the pulverizing at step S6, the solar cells 4 and the metal wirings 5 are separated from the enclosing layer 6 (step S7). The solar cells 4, the metal wirings 5, and the enclosing layer 6 pulverized at step S6 are separately collected and subjected to specific gravity separation for reuse. More specifically, the solar cells 4, the metal wirings 5, and the enclosing layer 6 are immersed in a predetermined solution for specific gravity separation. Unlike the peeling liquid used at step S4, the solution used for the specific gravity separation does not have affinity with the enclosing layer 6 and does not swell the enclosing layer 6. The solar cells 4, the metal wiring 5, and the enclosing layer 6 immersed in the solution are stirred and then left for a predetermined time. As a result, the specific gravity separation progresses so that the enclosing layer 6 having a specific gravity smaller than that of the solution emerges upward in the solution, while the solar cells 4 and the metal wirings 5 having a greater specific gravity sinks downward in the solution. The solution does not have affinity with the enclosing layer 6, and therefore the enclosing layer 6 can be easily separated. As a result, the solar cells 4/the metal wirings 5 and the enclosing layer 6 can be separated from each other and collected separately.

At step S7, the solution is heated (e.g., at 60° C. or higher) during the specific gravity separation. Heating of the solution leads to expansion of the enclosing layer 6, and thus an apparent specific gravity of the enclosing layer 6 decreases. The apparent specific gravity of the solution is also reduced by heating, but less reduced than that of the enclosing layer 6. Therefore, a difference in specific gravity between the solution and the enclosing layer 6 will increase so that the enclosing layer 6 easily emerges upwardly. This leads to a shortened time required for the specific gravity separation.

Figure 7:
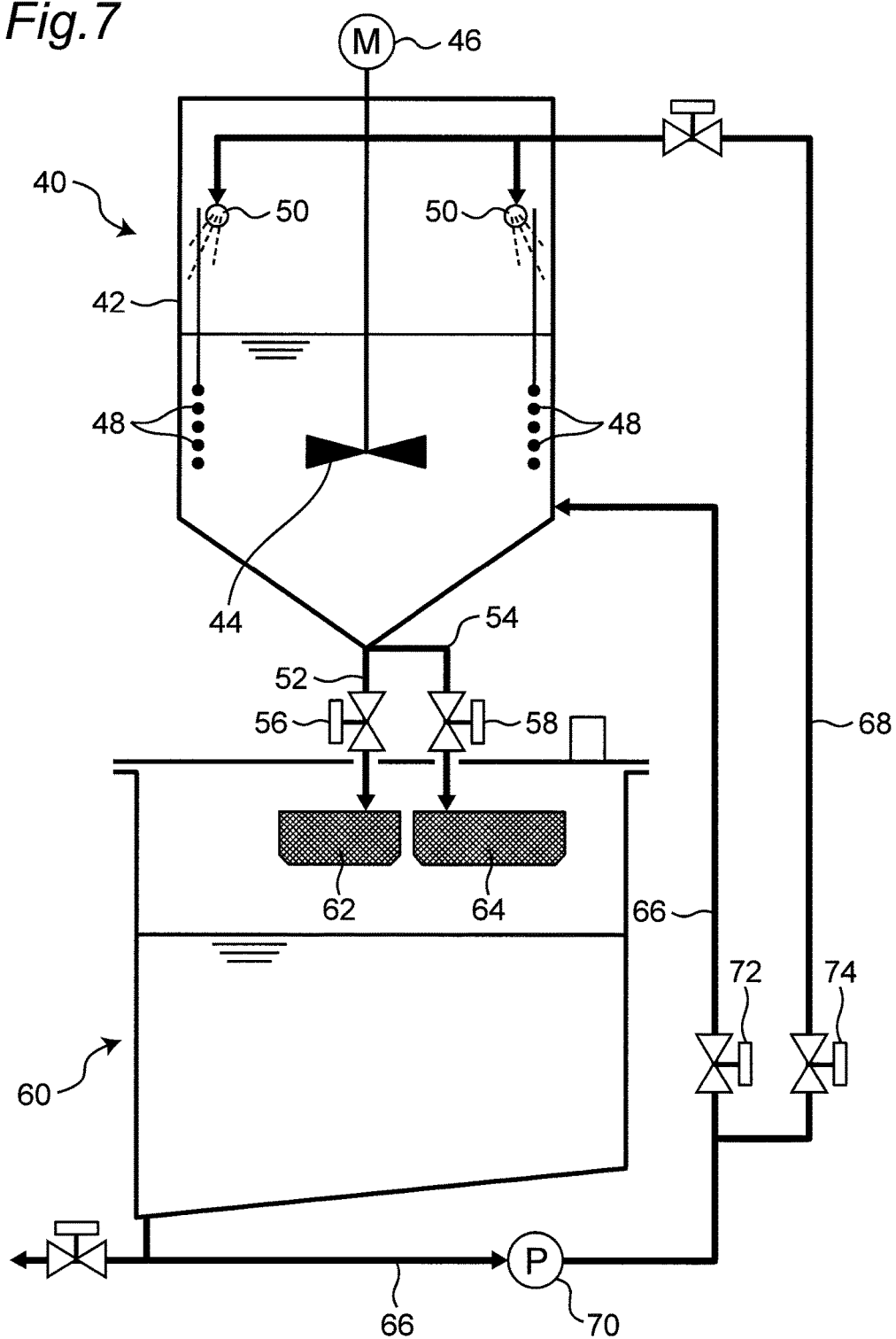
FIG. 7 shows an exemplary apparatus used in step S7.

FIG. 7 shows an exemplary apparatus used at step S7. An apparatus 40 shown in FIG. 7 includes a specific gravity separation tank 42, a stirring member 44, a stirring motor 46, a plurality of heaters 48, shower members 50, first and second recovery lines 52, 54, first and second valves 56, 58, a recovery tank 60, a lower-layer recovery basket 62, an upper-layer recovery basket 64, first and second resupply lines 66, 68, a pump 70, and third and fourth valves 72, 74.

The specific gravity separation tank 42 is configured to immerse the solar cells 4, the metal wirings 5, and the enclosing layer 6 pulverized at step S6 into a solution for specific gravity separation. The stirring member 44 are blades for stirring the solution in the specific gravity separation tank 42. The stirring motor 46 is configured to rotate the stirring member 44. The heaters 48 are configured to heat the solution in the specific gravity separation tank 42. The shower members 50 are configured to supply a solution for specific gravity separation into the specific gravity separation tank 42. The shower members 50 are provided mainly for the purpose of washing off substances (that is, the solar cell 4, the metal wiring 5 and the enclosing layer 6) adhering to an inner side wall of the specific gravity separation tank 42 and the heater 48. The first recovery line 52 is a piping line that allows the solution existing in a lower layer in the specific gravity separation tank 42 to move out of the specific gravity separation tank 42. The first recovery line 52 is provided with the first valve 56. The second recovery line 54 is a piping line that allows the solution existing in an upper layer in the specific gravity separation tank 42 to move out of the specific gravity separation tank 42. The second recovery line 54 is provided with the second valve 58. For running the solution from the specific gravity separation tank 42 to the recovery tank 60, a control apparatus not shown opens the first valve 56 to run the solution through the first recovery line 52, and thereafter opens the second valve 58 to run the solution through the second recovery line 54. Thus, the solution in the lower layer in the specific gravity separation tank 42 is discharged into the first recovery line 52, while the solution in the upper layer in the specific gravity separation tank 42 is discharged into the second recovery line 54.

The recovery tank 60 is a tank configured to store the solution collected from the first and second recovery lines 52, 54. The lower-layer recovery basket 62 is disposed at a position receiving the solution collected from the first recovery line 52. The lower-layer recovery basket 62 mainly collects the solar cells 4 and the metal wirings 5 contained as impurities in the solution. The upper-layer recovery basket 64 is disposed at a position receiving the solution collected from the second recovery line 54. The upper-layer recovery basket 64 mainly collects the enclosing layer 6 contained as impurities in the solution. The first resupply line 66 is a piping line for supplying and returning the solution stored in the recovery tank 60 to the specific gravity separation tank 42. The second resupply line 68 is a piping line that branches off from the first resupply line 66. The second resupply line 68 is configured to supply and return the solution stored in the recovery tank 60 to the shower members 50. The pump 70 is configured to suck up the solution from the recovery tank 60 into the first resupply line 66. The third valve 72 is disposed in the first resupply line 66, and the fourth valve 74 is disposed in the second resupply line 68.

According to the above-described device 40, the solution in the specific gravity separation tank 42 is stirred by the stirring member 44, and then left as it is with being heated by the heater 48. Over time, the solar cells 4 and the metal wirings 5 having a high specific gravity has moved to the lower layer of the solution, and the enclosing layer 6 having a low specific gravity has moved to the upper layer of the solution. The first valve 56 is opened to run through the first recovery line 52 the solution which existed in the lower layer and contains the solar cells 4 and the metal wirings 5. Then, the solar cells 4 and the metal wirings 5 contained in the solution are caught by the lower-layer recovery basket 62. Subsequently, the first valve 56 is closed and the second valve 58 is opened to run through the second recovery line 54 the solution which existed in the upper layer and contains the enclosing layer 6. Then, the enclosing layer 6 contained in the solution is caught by the upper-layer recovery basket 64. The pump 70 is operated to run the solution stored in the recovery tank 60 to flow into the first resupply line 66. Depending on a solution amount in the specific gravity separation tank 42, opening of the third valve 72 or the fourth valve 74 is controlled. When the third valve 72 is opened, the solution will be supplied via the first resupply line 66 to the lower layer of the specific gravity separation tank 42. On the other hand, when the fourth valve 74 is opened, the solution will be supplied via the second resupply line 68 to the shower members 50 so that the enclosing layer 6, etc. adhering to the inner side wall of the specific gravity separation tank 42 and the heater 48 can be washed off.

In this way, the solar cells 4 and the metal wirings 5 are separated from the enclosing layer 6 by specific gravity separation using the solution for the specific gravity separation so as to be collected as each material, while the specific gravity separation can continuously be performed with reusing the solution.

The apparatuses shown in FIGS. 4 to 7 are merely examples, so the present invention is not limited to the apparatuses. Any apparatuses that are capable of executing steps described with reference to FIGS. 1 to 3 may be used.

Performing steps S1 to S7 described above can dissolve the solar cell module 2 into each material for reuse. Particularly, at step S4, the solar cells 4 and the metal wirings 5 are entirely removed from the solar cell module 2, and the enclosing layer 6 is removed to a depth between the light-receiving surface layer 8 and the solar cells 4 so that the remaining enclosing layer 6 having a predetermined thickness adheres to and remains on the surface of the light-receiving surface layer 8. Since the solar cells 4 are already entirely removed, it is sufficient to remove only the part of the enclosing layer 6 which adheres to the light-receiving surface layer 8 at subsequent step S5. Therefore, a time required for immersion treatment in the peeling liquid at step S5 can be extremely shortened, and also an amount of the peeling liquid required for step S5 can be reduced. Further, a removal time at step S5 is significantly shortened, thereby shortening a total processing time. As a result, an overall efficiency of the method of recycling the solar cell module 2 can be improved.

At step S5, the enclosing layer 6 is removed not only by immersion in the peeling liquid but also by grinding. Using both immersion and grinding leads to more reliable and efficient removing of the enclosing layer 6.

Furthermore, step S5 and steps S6, S7 can be performed separately in parallel as shown in FIG. 2. Performing step S5 and steps S6, S7 in parallel in this way can shorten the total processing time, thereby improving the overall efficiency of the method of recycling the solar cell module 2. Additionally, the solution used at step S5 is not mixed with the solutions used at steps S6, S7, thereby being reused separately and effectively. More specifically, the peeling liquid (that is, water-soluble hydrocarbon-based solvent) used at step S5, the separation-promoting solution (that is, alkaline hydrocarbon-based solvent) used at step S6, and the solution for specific gravity separation used at step S7 are not mixed with each other, so each of them can repeatedly be used and effectively be reused.

EXAMPLE

An example related to the above-described method of recycling the solar cell module 2 according to the embodiment will be described below.

In this example, an experiment was performed in order to observe a state of removal of the enclosing layer 6 etc. in the same solar cell module 2 as that of the embodiment, under a process condition described below. Steps S1 and S2 are omitted so that the collector box 12 and the frame 14 are already removed at the start of the experiment (that is, steps S3 to S7 were performed in this example).

<Process Condition>
  Shape of the solar cell module 2: rectangular parallelepiped of 530 mm in width×620 mm in length×4.5 mm in thickness
  Thickness of the back sheet 10: 0.3 mm
  Thickness of the enclosing layer 6: 1.0 mm
  Thickness of the solar cells 4: 0.2 mm
  Thickness of the light-receiving surface layer 8: 3.2 mm
  Material of the back sheet 10: mainly composite film of fluorine resin and PET
  Material of the enclosing layer 6: mainly ethylene-vinyl acetate copolymer (EVA)
  Material of the solar cells 4: mainly silicon
  Material of the light-receiving surface layer 8: mainly glass First, the back sheet 10 was ground in several stages by an NC router grinding machine to be removed with a ground amount of each stage set to 0.1 to 0.3 mm (step S3). A total time for the grinding was 15 minutes. The removed back sheet 10 was collected.

Next, the enclosing layer 6 and the solar cell 4 were ground in several stages by the same NC router grinding machine to be removed with a ground amount of each stage set to 0.1 to 0.3 mm (step S4). As a result, the enclosing layer 6 was ground by a thickness of about 0.9 mm, and the solar cells 4 was entirely ground. A total time for the grinding was 60 minutes. The removed enclosing layer 6 and the solar cells 4 were sucked and collected by a dust collector and then supplied to the pulverizing apparatus 39 shown in FIG. 6 (for step S6). On the other hand, the light-receiving surface layer 8 with the enclosing layer 6 adhering thereto having a thickness of about 0.1 mm was supplied to the apparatus 15 shown in FIG. 4 (for step S5).

(Step S5) Next, the light-receiving surface layer 8 with the enclosing layer 6 adhering thereto was immersed in a peeling liquid heated to 80° C. in the apparatus 15 shown in FIG. 4. At this time, ultrasonic waves were applied from the ultrasonic irradiation members 19 at frequencies of 38 kHz and 100 kHz switched every three minutes to promote removal. After immersing for about 5 to 30 minutes, the light-receiving surface layer 8 was pulled up from the immersion tank 16, and liquid draining was performed to the light-receiving surface layer 8 for about 5 minutes. Then, the light-receiving surface layer 8 was supplied to the apparatus 34 shown in FIG. 5 to be ground by the grinding brush 38. The enclosing layer 6 ground and removed from the light-receiving surface layer 8 was collected.

(Step S6) The enclosing layer 6 and the solar cells 4 ground by the NC router grinding machine and collected by the dust collector were stored in the container 41 in the pulverizing apparatus 39 shown in FIG. 6 to be added with a predetermined amount of the alkaline hydrocarbon-based solvent. The pulverizing means 43 was rotated at a rotational speed of 18000 to 20000 rpm to pulverize the enclosing layer 6 and the solar cells 4 for about 1 minute to make them finer.

(Step S7) Next, the pulverized enclosing layer 6 and the solar cells 4 were immersed in a solution heated to 80° C. in the specific gravity separation tank 42 in the apparatus 40 shown in FIG. 7. The pulverized enclosing layer 6 and the solar cells 4 were stirred with the stirring member 44 at 100 rpm for about 1 minute and then left in the solution for about 10 minutes for the specific gravity separation. Draining the lower layer of the solution to the lower-layer recovery basket 62 and draining the upper layer of the solution to the upper-layer recovery basket 64, thereby collecting silicon (that is, the solar cells 4) and metals (that is, the metal wirings 5) by the lower-layer recovery basket 62 and collecting the enclosing layer 6 by the upper-layer recovery basket 64. The collected materials were disposed in a vat to and then dried with a dryer etc.

According to the example, one solar cell module 2 was processed such that the solar cells 4 and the metal wirings 5 were separated from the enclosing layer 6 with high accuracy. Particularly, at step S5 of removing the enclosing layer 6, the highly-pure enclosing layer 6 with very few impurities was collected. Furthermore, step S5 was completed for about 30 minutes while the conventional method takes several hours to several tens of hours, thereby achieving a significantly shortened total processing time. As a result, the overall efficiency for the method of recycling the solar cell module 2 was improved dramatically. Furthermore, a large portion of the enclosing layer 6 was mechanically removed at step S4 before step S5, so an amount of the peeling liquid used at step S5 for peeling and removing the remaining enclosing layer 6 was reduced significantly. Thus, escaping of the expensive peeling liquid outside a system was reduced and a significant cost reduction was achieved.

The present invention is not limited to the embodiment and can be implemented in various other forms. For example, step S5 uses the brush (that is, the grinding brush 38) for grinding, but not limited thereto the enclosing layer 6 may be scraped off by a means with edge such as a knife, or may be ground by any grinding means such as steel wool, a spatula rubber roll, etc. S5 performs the grinding in the embodiment, but not limited thereto may perform only the immersion using the immersion liquid instead of the grinding.

In the embodiment, ethylene-vinyl acetate copolymer (EVA) is exemplified as the material of the enclosing layer 6, but the present invention is not limited thereto. For example, any materials that are capable of enclosing the solar cells 4 and the metal wirings 5 and transmitting sunlight may be used, including PVB (polyvinyl butyral).

In the embodiment, the solar cells 4 and the enclosing layers 6 are pulverized by the high-speed mixer at step S6 before step S7, but not limited thereto specific gravity separation may be performed to them without involving the pulverization.

By properly combining any of the aforementioned various embodiments, the effects possessed by them can be produced.

The present invention is applicable to a method of recycling a solar cell module including an enclosing layer that encloses a solar cell therein, a light-receiving surface layer laminated on the enclosing layer, and a back sheet laminated on the enclosing layer to be opposite to the light-receiving surface layer.

The present invention has sufficiently been described in relation to the preferred embodiment with reference to the accompanying drawings, but various changes and modifications thereof are apparent for those skilled in the art. Such changes and modifications should be understood to be encompassed therein as far as not departing from the scope of the present invention described in the appended claims.

The disclosed contents of the specification, the drawings, and the claims of Japanese Patent Application No. 2015-185738 filed on Sep. 18, 2015 are incorporated herein by reference in its entirety.

What is claimed is:

1. A method of recycling a solar cell module comprising an enclosing layer that encloses a solar cell therein, a light-receiving surface layer laminated on one surface of the enclosing layer, and a back sheet laminated on the other surface of the enclosing layer, the method comprising:
   a first removing step of mechanically removing the back sheet;
   a second removing step of mechanically removing from the solar cell module, from a side on which the back sheet is removed, the solar cell in its entirety and the enclosing layer to such a depth that a part of the enclosing layer having a predetermined thickness remains on the light-receiving surface layer, after the first removing step; and
   a third removing step of removing the part of the enclosing layer remaining on the light-receiving surface layer by immersion in a solution that causes swelling of the enclosing layer, after the second removing step.

2. The method of recycling a solar cell module according to claim 1, wherein the third removing step comprises grinding after the immersion in the solution for removing the enclosing layer remaining on the light-receiving surface layer.

3. The method of recycling a solar cell module according to claim 2, wherein the grinding is performed by a brush.

4. The method of recycling a solar cell module according to claim 1, further comprising a pulverizing step of pulverizing the solar cell and the enclosing layer removed by the second removing step, and a separating step of separating the pulverized solar cell and the pulverized enclosing layer from each other using specific gravity separation by immersing them in a solution.

5. The method of recycling a solar cell module according to claim 4, wherein an alkaline hydrocarbon-based solvent is applied to the solar cell and the enclosing layer in the pulverizing step.

6. The method of recycling a solar cell module according to claim 4, wherein the solution used in the separating step has a change rate of specific gravity associated with temperature increase, the change rate being smaller than that of the enclosing layer.

7. The method of recycling a solar cell module according to claim 1, wherein the second removing step comprises a step of mechanically removing the enclosing layer to a depth not reaching the solar cell from the side on which the back sheet is removed, and separately comprises a step of mechanically removing what remains of the enclosing layer enclosing the solar cell to such a depth that a part of the enclosing layer remains on the light-receiving surface layer.

8. The method of recycling a solar cell module according to claim 1, wherein the solution used in the third removing step is a neutral peeling agent containing a water-soluble hydrocarbon-based solvent.

9. The method of recycling a solar cell module according to claim 1, wherein the enclosing layer is made of an ethylene-vinyl acetate copolymer.

* * * * *